United States Patent [19]
Hanks

[11] Patent Number: 4,947,404
[45] Date of Patent: * Aug. 7, 1990

[54] MAGNET STRUCTURE FOR ELECTRON-BEAM HEATED EVAPORATION SOURCE

[76] Inventor: Charles W. Hanks, c/o Electron Beam Technology, 3661 Willowick Dr., Ventura, Calif. 93003-1051

[*] Notice: The portion of the term of this patent subsequent to May 30, 2006 has been disclaimed.

[21] Appl. No.: 355,440

[22] Filed: May 22, 1989

Related U.S. Application Data

[63] Continuation-in-part of Ser. No. 121,152, Nov. 16, 1987, Pat. No. 4,835,789.

[51] Int. Cl.[5] .......................................... H01J 37/305
[52] U.S. Cl. ...................................................... 373/14
[58] Field of Search ...................... 373/10, 13, 14, 12, 373/11; 439/942

[56] References Cited

U.S. PATENT DOCUMENTS 4,064,352 12/1977 Mann .................................... 373/13

Primary Examiner—Roy N. Envall, Jr.
Attorney, Agent, or Firm—Julian Caplan

[57] ABSTRACT

A crucible contains a metal to be evaporated by heating from an electron beam source wherein the path of the electrons is controlled by a horizontal transverse magnetic field over the source and crucible. A number of small individual magnets are arranged horizontally along opposite sides of the crucible parallel to the beam path. The inner end of each magnet is in the closest position possible to deliver its flux lines to the magnetic field area. By varying the positions of the magnets, the field generated may be controlled in the desired manner.

22 Claims, 6 Drawing Sheets

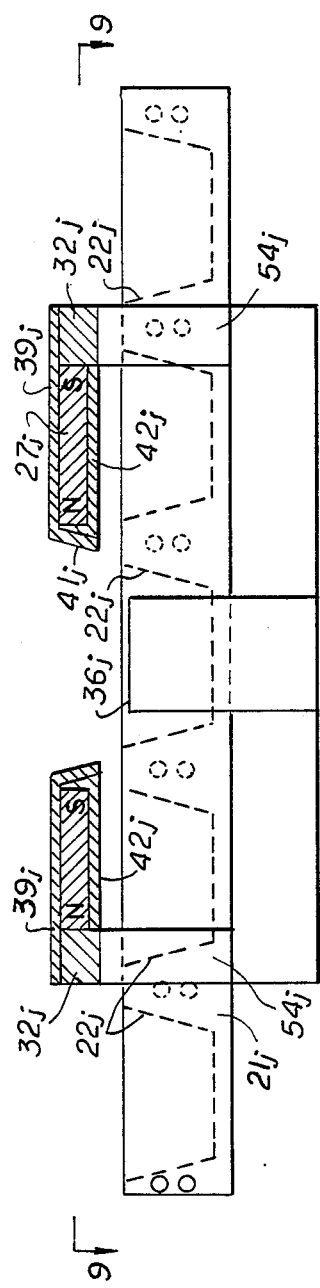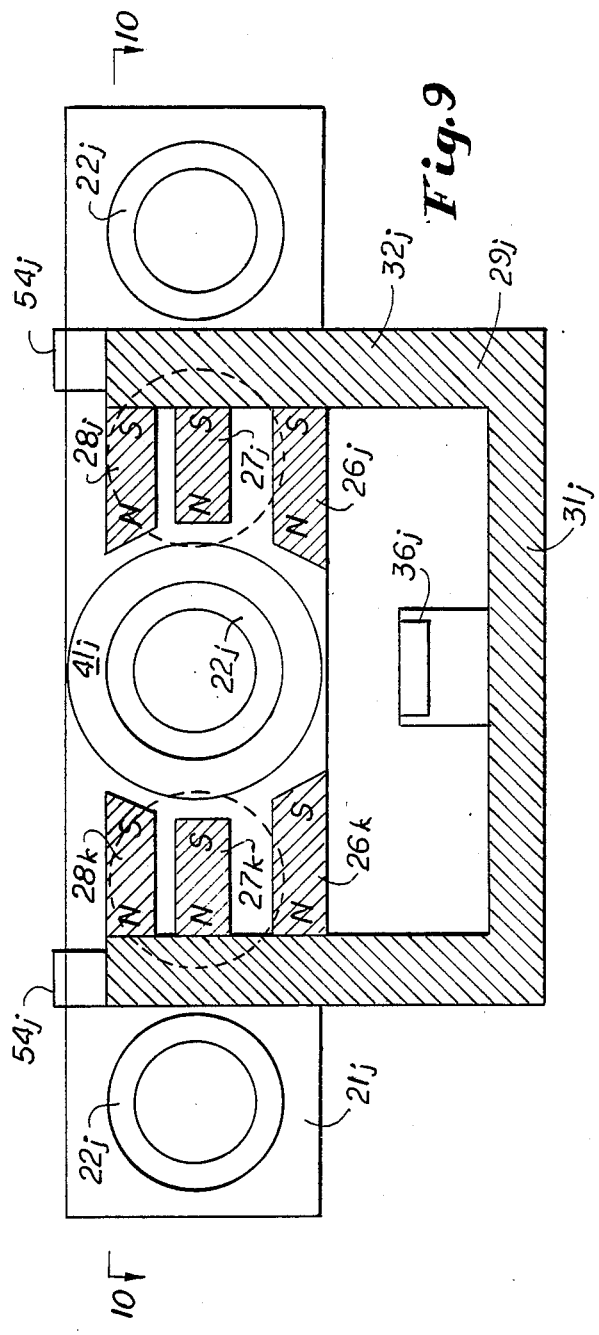

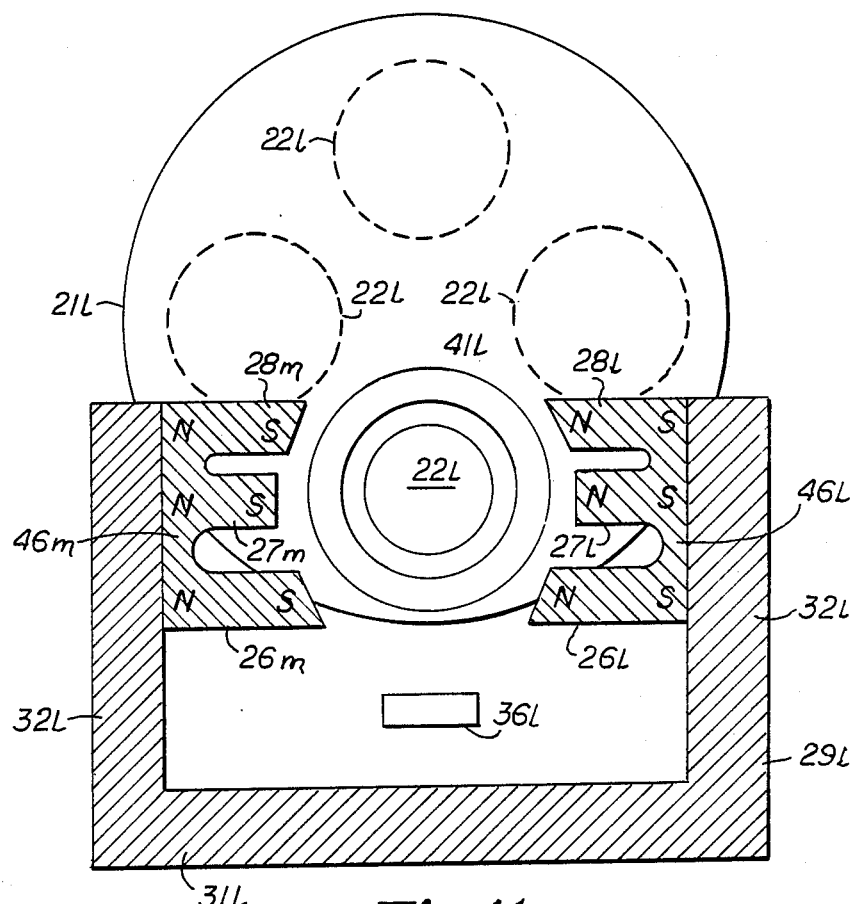
Fig. 11
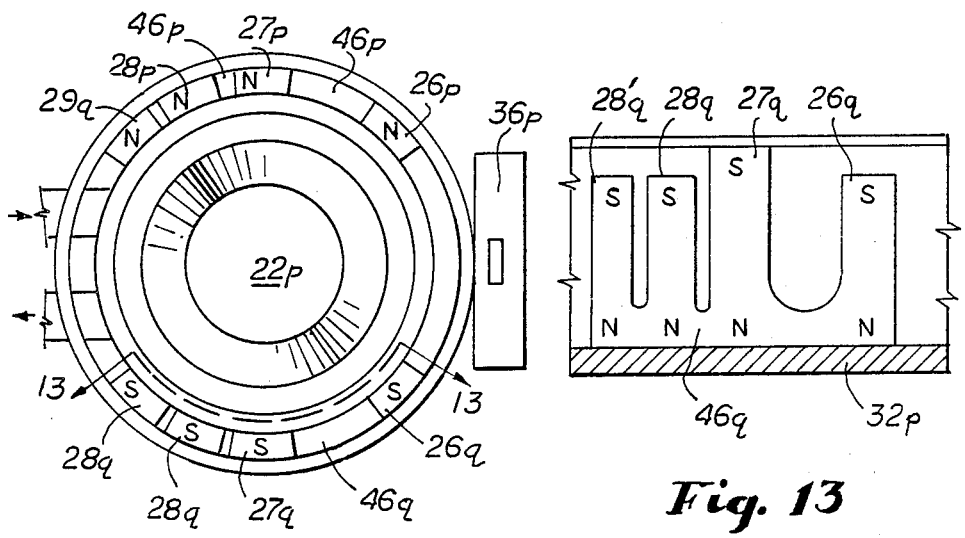
Fig. 12
Fig. 13

MAGNET STRUCTURE FOR ELECTRON-BEAM HEATED EVAPORATION SOURCE

CROSS-REFERENCE TO RELATED APPLICATION

This application is a continuation-in-part of Applicant's copending application Ser. No. 121,152, now U.S. Pat. No. 4,835,789, filed Nov. 16, 1987, entitled ELECTRON-BEAM HEATED EVAPORATION SOURCE, now U.S. Pat. No. 4,835,789. In the present invention, plural discrete magnets are positioned horizontally rather than vertically. The invention is particularly useful in multiple crucible installations.

BACKGROUND OF THE INVENTION

1. Field of the Invention

This invention relates to a new and improved horizontal magnet structure for electron beam heated evaporation source. More particularly, it relates to an electron beam heated source for use in a high vacuum environment to make high grade thin film coatings and the like. An electron-beam gun is positioned on one side of a turret containing multiple crucibles or an array of crucibles. The substance or substances which are to be evaporated are positioned in the individual crucibles. An electron beam gun is positioned such that the evaporated substance does not damage the gun. In order to direct the path of the electrons emitted from the gun to a particular crucible, a plurality of magnets is disposed horizontally on opposite sides of a particular crucible the substance of which is being evaporated, thereby creating a transverse magnetic field extending over the top of the gun and the substance to be evaporated. Positioning the magnets guides and focuses the electrons in a convex path upward and down into the substance in the crucible. The magnets may be either permanent or electro or a combination thereof.

2. Description of Related Art

The aforesaid patent application of which this is a continuation-in-part and the references cited by the Patent Office thereagainst adequately describes prior art known to Applicant. Magnetic measurements of intensity at various positions in the crucible area as well as above and well below the crucible top show that the main source of magnetic flux along vertically placed magnets is at the top ends and the area very close to the ends. It therefore is desirable that the geometry of the emitter, magnet and multiple crucibles be constructed in accordance with the present invention whereby the magnets are horizontally disposed. Where there is a turret-like array, it would be difficult to place vertical magnets around crucibles without great magnetic complexity ensuing. By using horizontally disposed magnets, the foregoing disadvantages are overcome.

SUMMARY OF THE INVENTION

It is possible to have the same degree of beam guidance from emitter to evaporant by placing magnets horizontally with the appropriate north and south ends placed in the same place in space as those of the vertical magnets used in a single crucible installation such as is shown in the aforesaid copending application Ser. No. 121,152.

A steel base plate or magnetic return connects the captive ends of the magnets. Although this is a longer, U-shaped piece than the straight, rectangular base plate shown in the aforesaid application used with vertical magnets, because steel has such low magnetic reluctance, the effect of a slightly longer steel path is not discernible.

The magnetic field quality of an E-gun with this type of horizontal magnets appears to be better than in an E-gun with vertical magnets. The reason for this is because the small amount of leakage flux from the magnet from near the beam path to the other end at the junction with the steel base plate magnetic return has more effect on the main field in the crucible area than is the case of horizontal magnets where such leakage flux would be directed a further 90 degrees away from the crucible to a horizontal position well above the crucible.

A large majority of E-gun heated sources used in the United States are of a multiple crucible geometry. A group of two or more crucibles used together with means sequentially moving each individual crucible under the beam impact to generate two different vapor deposits alternatively is widely used in the optics industry to make one-quarter wave stacks and other types of thin film band pass filters. Furthermore, equipment which makes long evaporation runs of the same material may use multi-pocket assemblies so as to have a large stock of evaporant at hand. Commonly, multi-pocket evaporation arrays are in a disk-like turret arrangement. The turret is indexed so that each crucible in turn is brought into position where it is impacted by the electrons from the emitter. Water-cooling passageways in a central post for the turret which guides the crucible assembly rotation are sealed by elastomeric rings. Hence the use of this type of equipment is not usable in UHV vacuum ranges. However, in UHV ranges a linear array of crucibles may be used, each crucible being pushed past the emitter position by the use of a long, sealed metal bellows arrangement to make the crucibles movable but with an all-metal construction so that there is no outgassing.

A further feature of the invention is the use of a unitary array of plural magnets having a common base.

Other objects of the present invention will become apparent upon reading the following specification and referring to the accompanying drawings in which similar characters of reference represent corresponding parts in each of the several views.

IN THE DRAWINGS

FIG. 9 is a top plan view partially in section showing the invention adapted to a linear array of crucibles.

FIG. 10 is a sectional view taken substantially along line 10—10 of FIG. 9.

FIG. 11 is a view similar to FIG. 1 showing a unitary array of plural magnets having a common base.

FIG. 12 is a plan view of a modified crucible having vertical arrays of magnets.

FIG. 13 is an enlarged view of magnets viewed along line 13—13 of FIG. 12.

DESCRIPTION OF PREFERRED EMBODIMENTS

Figure 1:
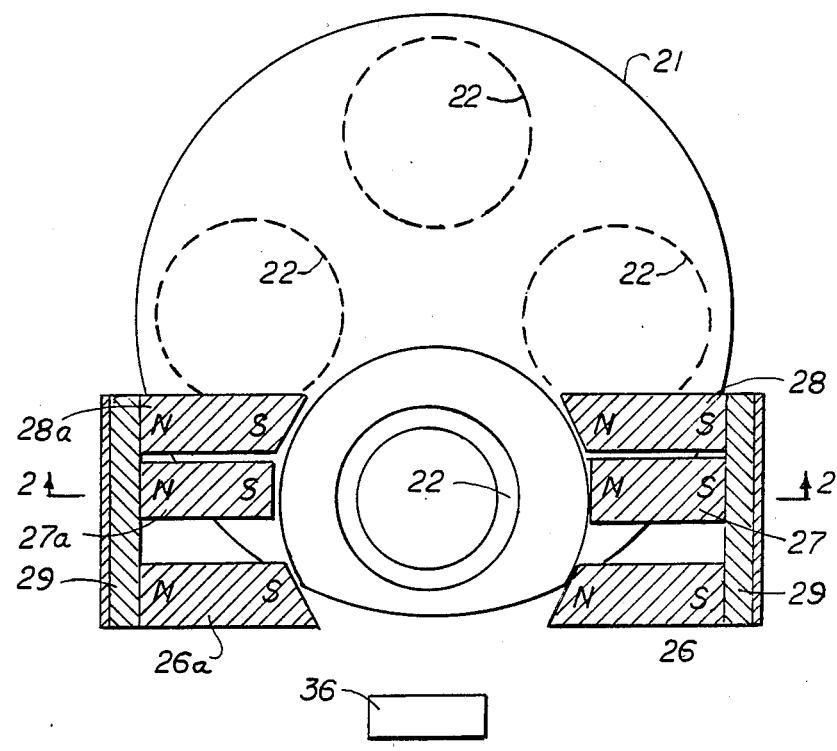
FIG. 1 is a schematic top plan view of one form of the invention.
Figure 2:
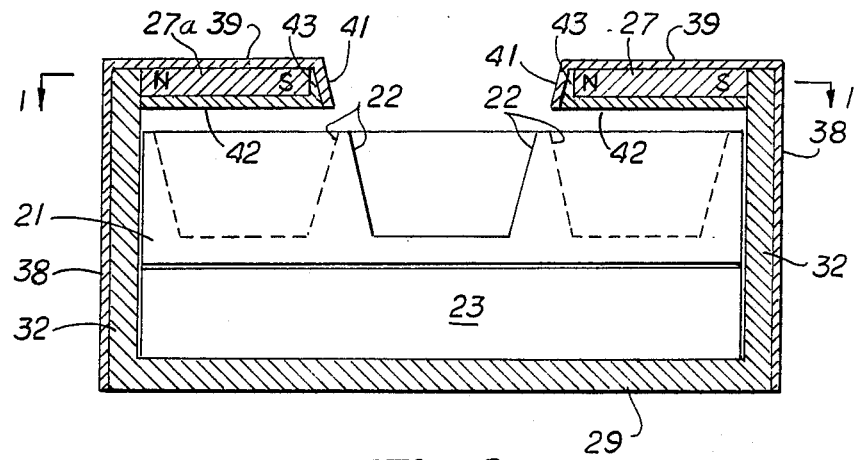
FIG. 2 is a transverse vertical sectional view taken substantially along the line 2—2 of FIG. 1.

Directing attention first to the modification shown in FIGS. 1 and 2, turret body 21 (preferably made of copper and having cooling passageways not shown, but adequately described in the aforesaid application Ser. No. 121,152) contains plural crucibles 22, here shown as four in number. It will be understood that fewer or more crucibles may be used in each turret. The evaporant in each crucible may be different. In such case, multi-layer coatings may be evaporated onto the object to be coated by rotating the turret so that one crucible at a time is brought under an electron beam source. On the other hand, the evaporant in all of the crucibles may be the same so that when the content of one crucible is exhausted, the next crucible may be brought into position in the electron path.

Various means for rotating the turret 21 may be employed, as is well understood in the art. Thus a turret base 23 is shown and the means whereby base 23 causes turret 21 to rotate 90 degrees while maintaining the passage of coolant through the passages of the turret body is not illustrated but is well understood in this art.

Positioned above the level of the top of turret body 21 on one side of the path of electrons emitted from E-gun 36 are three permanent magnets, 26, 27, and 28. The magnets 26–28 are horizontally disposed and all on the right side of FIG. 1 have their north poles positioned closest to the crucible 22 which is at any particular time being evaporated. The terms "right" and "left" are with reference to the direction of electron flight. On the other side of crucible 22 are three other magnets, 26a, 27a, 28a, all also horizontally disposed and having their south poles nearest the crucible 22. Thus the magnets 26–28 on the right side directly oppose the magnets 26a–28a on the left side, and a magnetic path is established between the magnets on one side and the other. It will be understood, of course, that instead of three magnets, any number of horizontally disposed magnets may be employed.

Steel yoke 29 is of a U-shape and has a bottom 31 below the turret base 23 and sides 32 extending up on either side of 20 the turret base 33 and turret body 21 to the level of the magnets. The outer edge of each magnet 26–28 and 26a–28a is in direct contact with one of the sides 32 of yoke 29.

For efficient operation, there is preferably a copper jacket 38 on the outside of the vertical sides 32 of yoke 29. Further, inward extending top members 39 also of copper extend over the tops of the magnets and there are inwardly downwardly slanted sides 41 inside the innermost ends of the magnets. The angle of sides 41 is approximately equal to that of the sides of the crucibles 22. Bottom 42, also of copper, is positioned under each array of magnets and the inner ends 43 thereof extend up inside the sides 41.

The modification of FIGS. 1 and 2 shows the basic outline of an arrangement of horizontal magnets which provides a proper magnetic field for the focusing and guidance of electrons from source 36 to the evaporant in one of the crucibles 22. However, the area beneath the magnets is open for the passage of other crucibles in the turret.

Figure 3:
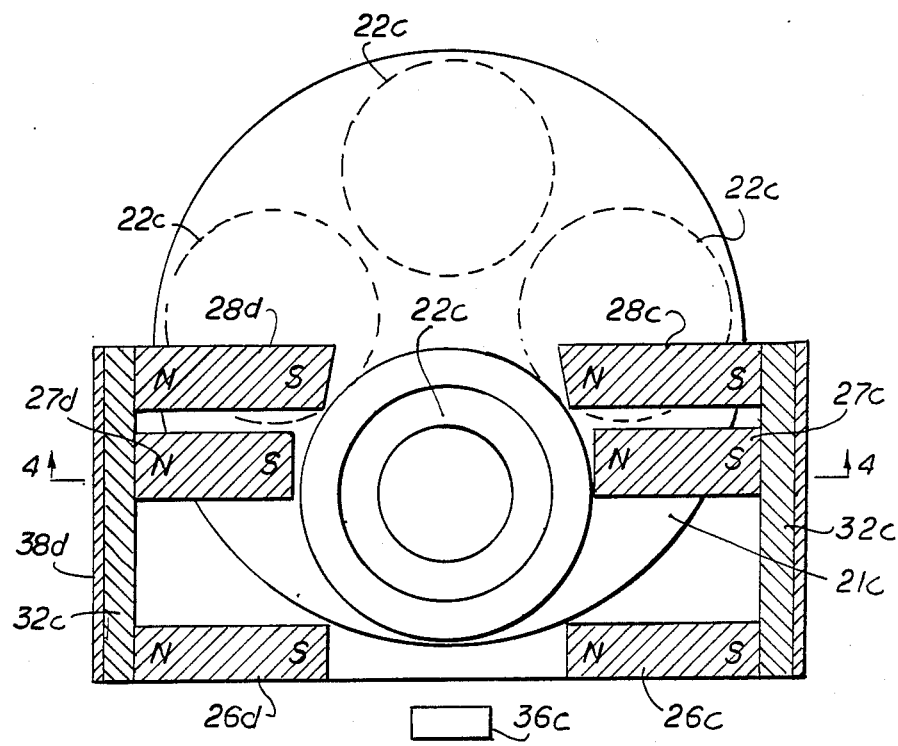
FIG. 3 is a schematic top plan view of a modification.
Figure 4:
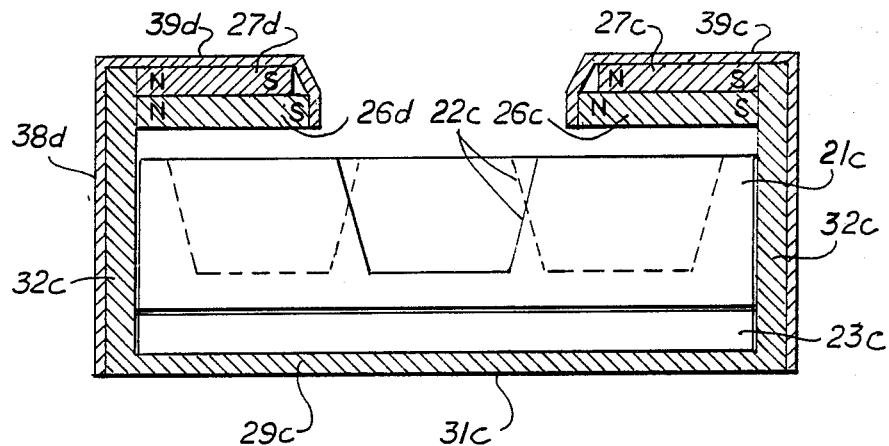
FIG. 4 is a vertical sectional view taken substantially along the line 4—4 of FIG. 3.

Directing attention now to the modification shown in FIGS. 3 and 4, the location of horizontal magnets placed about the E-beam path from emitter to evaporant indicates that of major importance is the location or position of the innermost ends of the magnets closest to the crucible. The ends of the magnets closest to the crucible deliver the flux to the beam path. The opposite ends of the magnets are tight against the steel yoke that connects the outer ends of the opposed sets of magnets.

Note in FIG. 3 that magnets 26c and 26d are closest to the emitter source and that 28c and 28d are beyond the crucible 22c.

In many respects the modification of FIGS. 3 and 4 resembles that of FIGS. 1 and 2 and the same references numerals followed by the subscripts c and d indicate parts corresponding to the parts in FIGS. 1 and 2 without subscripts or with subscript a, respectively.

In FIGS. 3 and 4 the elevation of magnets 26c and 27c is different in FIG. 4 than in FIG. 2. In essence, the positioning of the magnets may be subject to experimentation in order to achieve the best pattern. Using small, discrete horizontally disposed magnets having their inner ends close to the electron beam path from the emitter to beyond the crucible improves performance.

Figure 5:
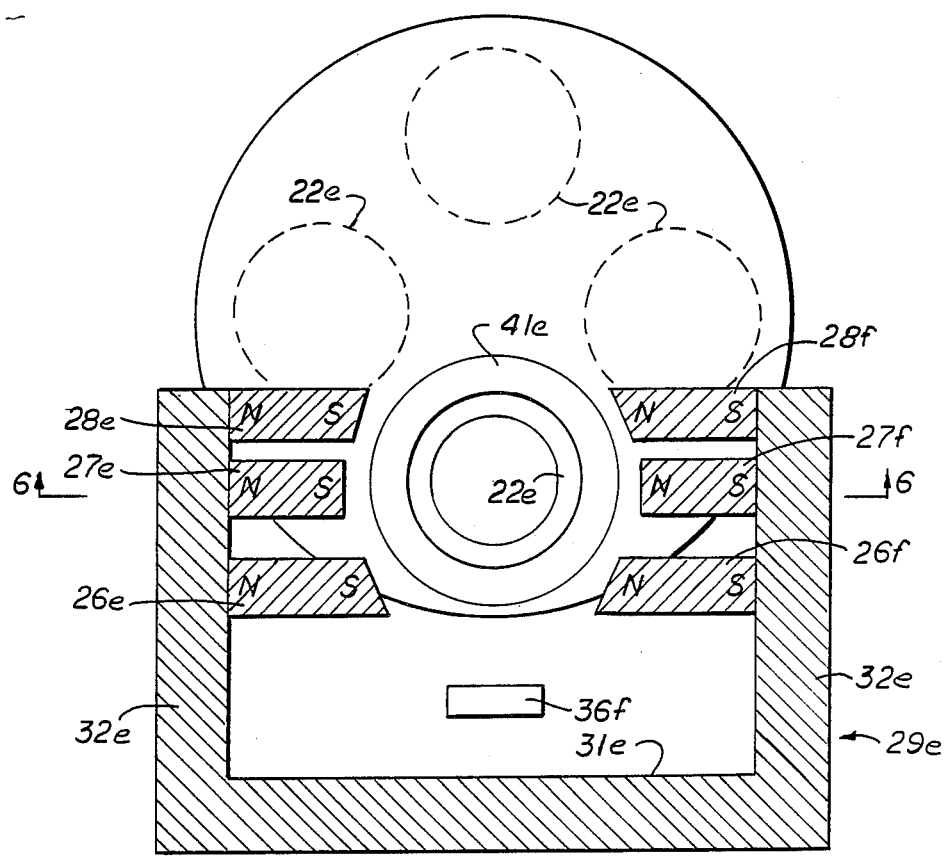
FIG. 5 is a schematic top plan view of still another modification.
Figure 6:
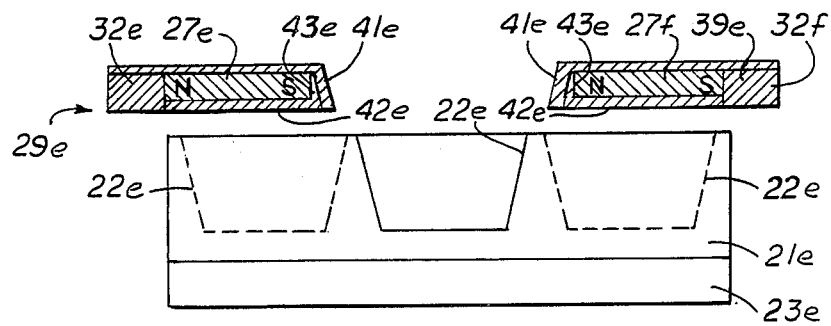
FIG. 6 is a sectional view taken substantially along the line 6—6 of FIG. 5.

Turning now to the modification shown in FIGS. 5 and 6, the steel yoke 29e, instead of passing under the turret mechanism 23e is disposed horizontally. This arrangement allows a maximum amount of free space under the focusing magnetic fields which control the electron paths. This arrangement allows more freedom of choice of type and size of crucible with an increased number of crucibles and even a long linear array of multiple crucibles. An inverted crescent-shaped trough slowly rotated past the beam and thus bringing a continuous supply of fresh di-electric material to be evaporated is also achieved by this arrangement.

In other respects, the modifications of FIGS. 5 and 6 resemble that of FIGS. 1 and 2 and the same reference numerals followed by the subscript e indicates corresponding parts except that the right hand magnets of FIG. 5 employ the subscript f.

Figure 7:
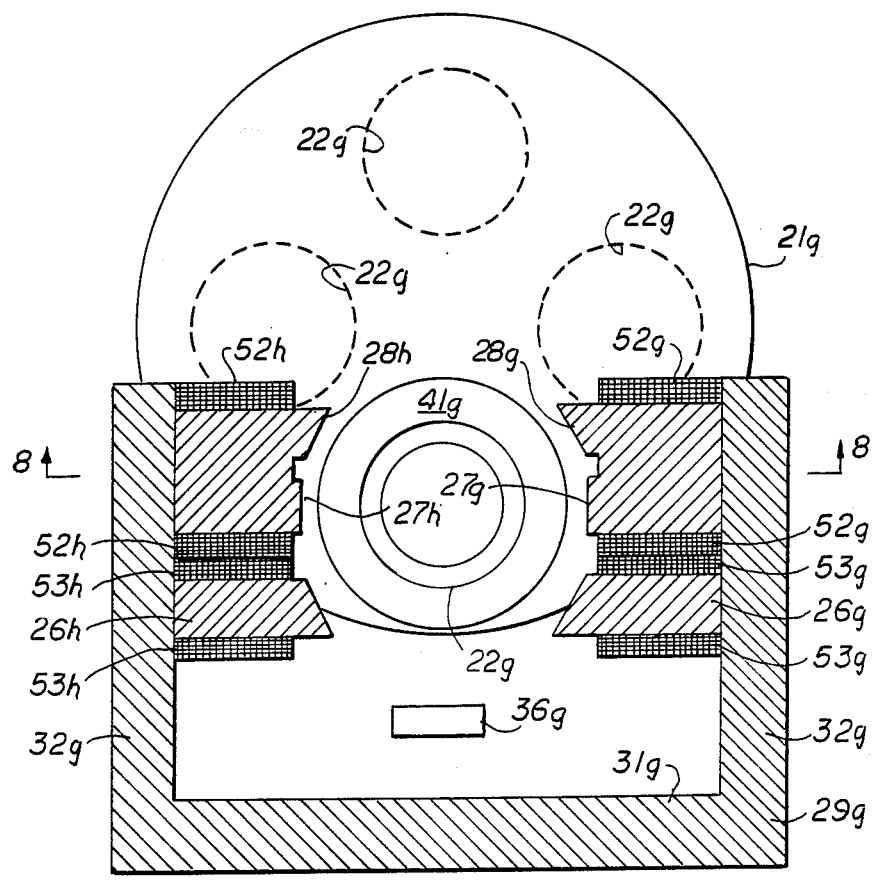
FIGS. 7 and 8 are views similar to FIGS. 3 and 1, respectively, modified by using electro-magnets.
Figure 8:
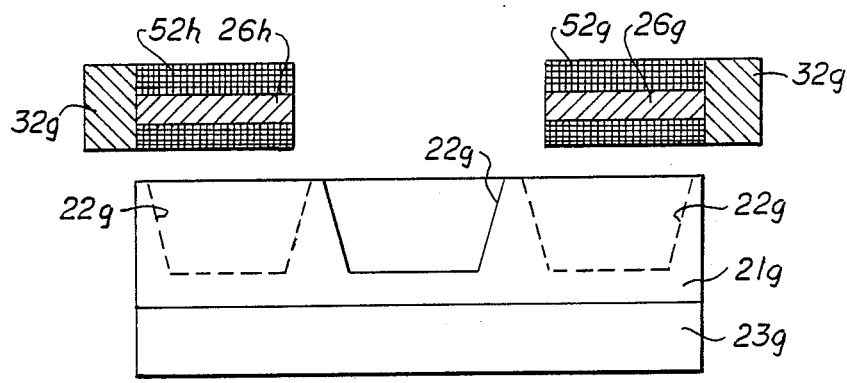

FIGS. 7 and 8 illustrate use of electromagnets instead of permanent magnets. The electromagnets may have the same general pole end geometry and location in space as do permanent magnets. The rearward cores 27g and 27h may be energized by electromagnetic coil 52h on the left and 52g on the right to provide the major amount of flux over crucible 22g. The forward magnets 26g and 26h are energized by coil 53g on the right and 53h on the left. Their main purpose is to adjust the amount of flux for movement of the beam fore and aft although all of them may be used together.

In many respects the modification of FIGS. 7 and 8 resembles that of FIGS. 1 and 2 and the same reference numeral followed by subscripts g and h are used to designate corresponding parts.

FIGS. 9 and 10 show a linear array of crucibles 22j. By means well understood in the art and hence not illustrated and described herein, the individual crucibles may sequentially be brought into position under the magnets. The crucibles may contain the same evaporant so that as one crucible is depleted another is brought into position. Alternatively the crucibles may contain different evaporants so that different coatings may be applied to the same or different work pieces, particularly in UHV environments.

Although a magnet array similar to that of FIGS. 1 and 2 is shown in FIGS. 9 and 10, it will be understood that the linear array structure may be adapted to other magnet arrays.

In FIGS. 9 and 10 the subscripts j and k have been applied to the basic reference numerals to indicate parts similar to the preceding modifications.

FIG. 11 shows a still further modification wherein a unitary array of plural magnets 26*l*, 27*l*, 28*l* (here shown as three, but subject to modification) having a common base 46 and preferably cast together is shown. Thus the system employs plural magnets having discrete inner ends extending from a common base 46. The inner ends of magnets 16*l*, 27*l*, 28*l* are free but their outer ends are joined in a common base 46. Thus the array may be handled and located in the fabrication of the structure as a unit. The inner ends (nearest the beam) function as discrete units, as in the previous modifications. Each outer end provides its own flux out of the common base 46. On the opposite side of the crucible, are magnets 26*m*, 27*m* and 28*m*, also preferably cast together.

In FIG. 11 the subscripts l and m are applied to the basic reference numerals to indicate parts similar to the preceding modifications.

In FIG. 12 magnets 26–29 are vertically disposed and arranged in a manner similar to said Ser. No. 121,152. Referring specifically to FIG. 13, there are four vertically disposed magnets 26*q*–29*q* having their South poles discrete and their North poles joined in a common base 46*q*. It will be understood that magnets 26*p*–29*p* are similarly joined at a common base 46*p* but with the North poles as discrete and the South poles joined in a common base.

In other respects the modification of FIGS. 12–13 resemble the previous modifications and the same reference numerals followed by subscripts p and q indicate corresponding parts.

What is claimed is:

1. An evaporation source apparatus comprising a crucible containing said source having a generally horizontal surface, an electron beam source displaced from said crucible, and means for directing electrons in a path from said source to said crucible comprising
    a first plurality of discrete magnets of a first polarity positioned horizontally and spaced apart from each other on a first side of said crucible and on a first side of said path, and
    a second plurality of discrete magnets of a second polarity opposite said first polarity positioned horizontally and spaced apart from each other on a second side of said crucible and a second side of said path opposite said first side,
    all of said magnets being on the same side of said source as said crucible.

2. Apparatus according to claim 1 which further comprises a yoke interconnecting the ends of all said magnets remote from said path.

3. Apparatus according to claim 2 in which said yoke is steel.

4. Apparatus according to claim 3 which further comprises a jacket around a substantial portion of said yoke.

5. Apparatus according to claim 4 in which said jacket is copper.

6. Apparatus according to claim 5 which further comprises copper jackets around said magnets.

7. Apparatus according to claim 1 in which the number of said first plurality of magnets equals said second plurality of magnets.

8. Apparatus according to claim 1 in which said magnets are positioned with each of said first plurality of magnets directly opposite a corresponding magnet of said second plurality of magnets.

9. Apparatus according to claim 1 in which said magnets are permanent magnets.

10. Apparatus according to claim 1 in which said magnets are electro-magnets.

11. Apparatus according to claim 1 in which all said magnets are approximately equidistant from the center of said crucible.

12. Apparatus according to claim 1 in which said discrete magnets are the sole force for directing electrons in said path.

13. Apparatus according to claim 1 which further comprises a second crucible spaced from said firstmentioned crucible, said magnets being initially remote from said second crucible and crucible transport means for moving said first crucible away from said magnets and said second crucible into the position previously assumed by said first crucible.

14. Apparatus according to claim 13 in which said transport means comprises a rotary turret, said first and second crucible being located in said turret and angularly spaced from each other, and means for indexing said turret.

15. Apparatus according to claim 12 in which said transport means comprises means supporting said first and second crucibles in linear array and means for linearly moving said crucibles.

16. Apparatus according to claim 1 in which some of said magnets are at a different elevation from other said magnets.

17. Apparatus according to claim 2 in which said yoke has a first portion below said crucible and upward extending legs on opposite sides of said crucible.

18. Apparatus according to claim 2 in which said yoke comprises a first portion disposed horizontally above the level of and remote from said crucible and horizontally disposed legs extending toward said crucible on opposite sides thereof.

19. Apparatus according to claim 1 in which said magnets have inner ends closest to said crucible and outer ends remote from said crucible, and which further comprises a first base joining the outer ends of said first plurality of magnets to form a first unitary array and a second base joining the outer ends of said second plurality of magnets to form a second unitary array.

20. An evaporation source apparatus comprising a crucible containing said source, an electron beam source displaced from said crucible, a means for directing electrons in a path from said electron source to said crucible comprising
    a first plurality of first magnets having discrete inner ends of a first polarity positioned spaced apart from each other on a first side of said crucible and on a first side of said path, said inner ends being closest to said crucible, and having outer ends remote from said crucible, said first magnets and a first base being cast together to form a first unitary array,
    a second plurality of second magnets having discrete inner ends of a second polarity opposite said first polarity spaced apart from each other on a second side of said crucible and a second side of said path opposite said first side, said second magnets and a second base being cast together to form a second unitary array.

21. Apparatus according to claim 20 in which said crucible is vertically disposed and said magnets are horizontally disposed.

22. Apparatus according to claim 20 in which said crucible is vertically disposed and said magnets are vertically disposed.

* * * * *